United States Patent [19]
Sakakibara

[11] Patent Number: 5,594,510
[45] Date of Patent: Jan. 14, 1997

[54] METHOD FOR TUNING THE CHANNEL OF BROADCASTING WAVES AND IDENTIFYING CHANNEL PLAN BY APPLYING MEMORIZED FREQUENCY DATA

[75] Inventor: Shigeto Sakakibara, Daito, Japan

[73] Assignee: Funai Electric Co., Ltd., Osaka, Japan

[21] Appl. No.: 533,480

[22] Filed: Sep. 25, 1995

[30] Foreign Application Priority Data

Jan. 19, 1995 [JP] Japan .................................... 7-024797

[51] Int. Cl.⁶ ........................................................ H04N 5/50
[52] U.S. Cl. .............................................. 348/731; 348/732
[58] Field of Search ....................................... 348/731–733

[56] References Cited

U.S. PATENT DOCUMENTS 5,087,977  2/1992  Suizu ........................................ 348/731

Primary Examiner—Victor R. Kostak
Assistant Examiner—Nathan J. Flynn
Attorney, Agent, or Firm—Keck, Mahin & Cate

[57] ABSTRACT

This invention is to provide a method for tuning the channel of a broadcasting wave which is able automatically to secure specified band zone and to shorten the time required for tuning. Namely, this method is characterized by starting the PLL tuning by applying the data of the center frequency of either the first channel plan memorized in advance in tuning the channel of broadcasting wave or the second channel plan differing from the allocation of frequencies for said first channel plan, and by judging whether said broadcasting station belongs to either the first channel plan or the second channel plan by applying the tuned frequency at the time that said tuning is finished, and further by renewing said memorized data of the center frequency according to said judged result.

9 Claims, 3 Drawing Sheets

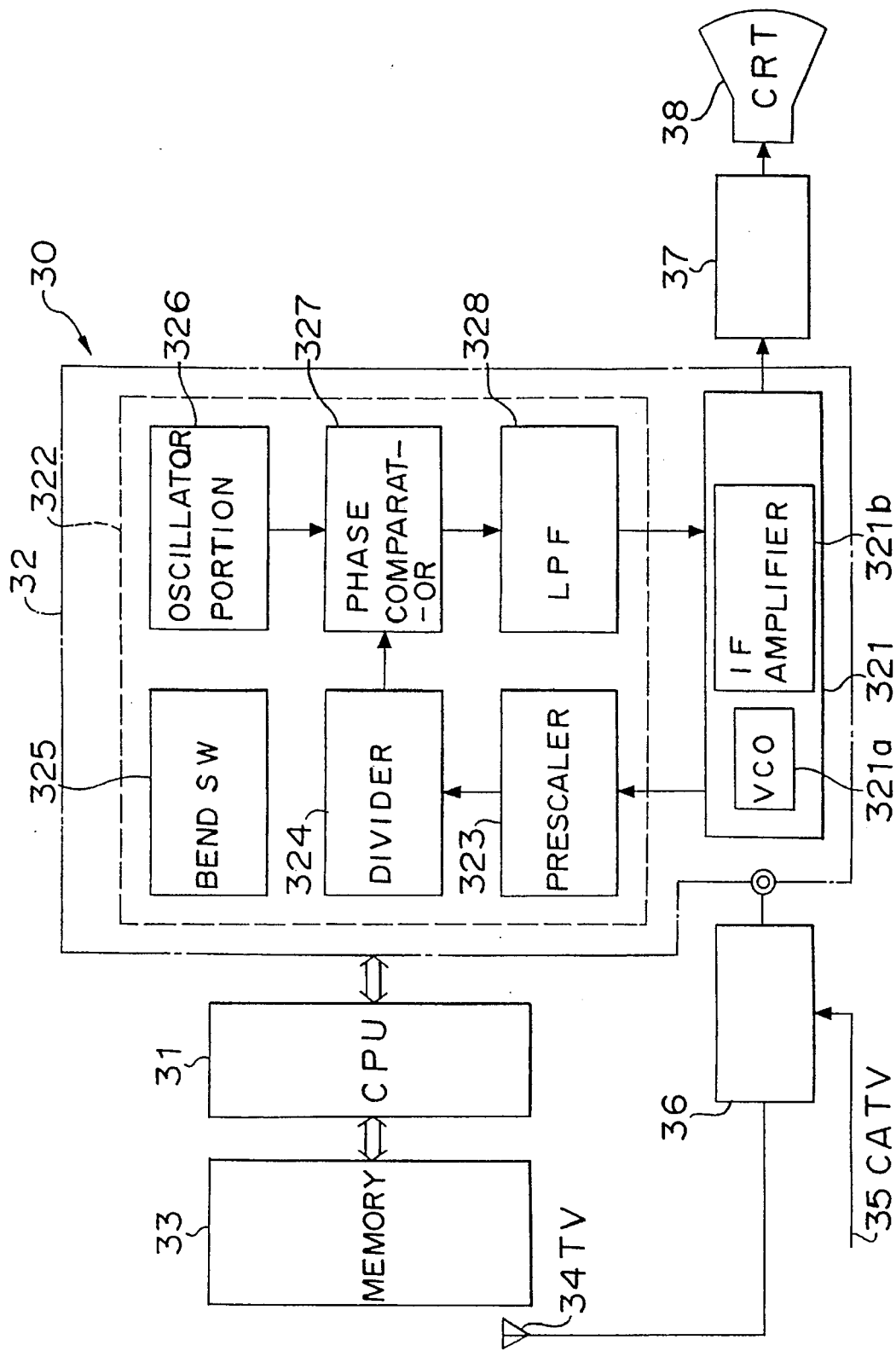

METHOD FOR TUNING THE CHANNEL OF BROADCASTING WAVES AND IDENTIFYING CHANNEL PLAN BY APPLYING MEMORIZED FREQUENCY DATA

BACKGROUND OF THE INVENTION

The present invention relates to a method for tuning the channel of broadcasting waves, and more particularly relates to a method for tuning the channel of broadcasting waves received by a television set capable of receiving broadcasting waves of CATV stations.

Generally, in referring to the signal wave equivalent to the broadcasting wave of a CATV station, each channel is allocated to plural band zones which are predetermined. And, each channel is also assigned to a different frequency zone of channel plan according to the region.

For example, in the United States either the Normal channel plan or the HRC channel plan having different frequency zones is allotted to each channel, as shown in Table 1.

TABLE 1

| TV/CATV | | CHANNEL PLAN | | | NORMAL | | HRC | |
|---|---|---|---|---|---|---|---|---|
| | | | | | Sound IF 41.25 MHz Picture IF 45.75 MHz | | | |
| CHNL IND | TV CHNL | fp (MHz) | fosc (MHz) | CATV CHNL | fp (MHz) | fosc (MHz) | fp (MHz) | fosc (MHz) |
| 1 | — | — | — | 5A | 73.25 | 119.00 | 72.00 | 117.75 |
| 2 | 2 | 55.25 | 101 | 2 | 55.25 | 101.00 | 54.00 | 99.75 |
| 3 | 3 | 61.25 | 107 | 3 | 61.25 | 107.00 | 60.00 | 105.75 |
| 4 | 4 | 67.25 | 113 | 4 | 67.25 | 113.00 | 66.00 | 111.75 |
| 5 | 5 | 77.25 | 123 | 5 | 77.25 | 123.00 | 78.00 | 123.75 |
| 6 | 6 | 83.25 | 129 | 6 | 83.25 | 129.00 | 84.00 | 129.75 |
| 7 | 7 | 175.25 | 221 | 7 | 175.25 | 221.00 | 174.00 | 219.75 |
| 8 | 8 | 181.25 | 227 | 8 | 181.25 | 227.00 | 180.00 | 225.75 |
| 9 | 9 | 187.25 | 233 | 9 | 187.25 | 233.00 | 186.00 | 231.75 |
| 10 | 10 | 193.25 | 239 | 10 | 193.25 | 239.00 | 192.00 | 237.75 |
| 11 | 11 | 199.25 | 245 | 11 | 199.25 | 245.00 | 198.00 | 243.75 |
| 12 | 12 | 205.25 | 251 | 12 | 205.25 | 251.00 | 204.00 | 249.75 |
| 13 | 13 | 211.25 | 257 | 13 | 211.25 | 257.00 | 210.00 | 255.75 |
| . | . | . | . | . | . | . | . | . |
| . | . | . | . | . | . | . | . | . |
| . | . | . | . | . | . | . | . | . |

In this Figure, for example, each CATV channel corresponding to channels 1 to 13 is constructed with either one of Normal channel plan or HRC channel plan. With respect to each of the center frequencies thereof, only channel 5 and channel 6 in the Normal channels are deviated as much as 0.75 MHz towards lower frequencies than that of the HRC channels, and the center frequencies of the Normal channels for all of the other channels are deviated as much as 1.25 MHz towards higher frequencies than that of the HRC channels.

Some television receivers capable of receiving CATV signals and television signals are provided with a tuning function for tuning the phase-locked loop (hereafter referred to as PLL tuning). A block diagram of such television receiver 30 is shown in FIG. 3.

In this Figure, the numeral 31 is a microcomputer controlling the whole system (hereafter referred to as CPU), and the numeral 32 is a PLL tuner portion tuned to the received channel, and the numeral 33 is a memory which memorizes the received channel number. The PLL tuner portion 32 is provided with a tuner/IF portion 321 and a PLL circuit 322.

The PLL circuit 322 is provided with a band switch 325, an oscillator portion 326 outputting the standard oscillating frequency signal having 4 MHz frequency, a phase comparator 327, a low pass filter 328, a prescaler 323 and a frequency divider 324. The tuner/IF portion 321 is provided with a VCO 321a functioning as the tuner portion receiving the selected channel and as one part of the above-mentioned PLL circuit 322, and a intermediate frequency amplifying portion 321b. The numeral 34 is an antenna which receives the television waves transmitted from the broadcasting stations, and numeral 35 is a cable for the CATV. The numeral 36 is a switch switching the received signal from the television antenna 34 and the received signal from the CATV cable 35. Also, the numeral 37 is an image signal conditioning circuit and the numeral 38 is a cathode ray tube.

In FIG. 3, the memory 33 in the television receiver 30 stores each channel's initial data under the Normal channel plan (namely, center frequency, the dividing ratios and others). In selecting a particular channel, the CPU 31 equivalent to the system controller of the television receiver 30 reads out the stored data of the channel, converts the data and transmits the data into the PLL circuit 322.

As the channel data are read out in accordance with the Normal channel plan, the PLL circuit 322 performs phase synchronization (PLL) by applying the frequency according to the data of the aforementioned Normal channel plan, and lets the tuner/IF portion 321 accommodate the specified channel frequency.

Wherein, the band zones as the PLL tuner portion 32 are formed in between 2 MHz towards the upper and lower sides from the tuned center frequency. Accordingly, for example, when channel 3 is designated, the receivable range lies in between 59.25–63.25 MHz equivalent to the frequency adjusted as much as 2 MHz towards the upper and lower sides from the center frequency of 61.25 MHz.

However, when channel No. 3 in this region belongs to the Normal channel plan, it becomes possible to receive channel no. 3 as it is without any problem, but when channel no. 3 in this region belongs to the HRC (Harmonically Related Carriers) channel plan, the 58–62 MHz adjusted as much as 2 MHz towards the upper and lower sides in centering with the 61.25 MHz corresponding to the tuned frequency of Normal channel no. 3, become the required band zone for receiving. But as this receiver is tuned with the Normal channel, then the receivable band zone is 59.25–63.25 MHz as mentioned above, and the lower side of the frequency zones is cut off as much as 1.25 MHz. This cut-off zone is shown as Mark B in FIG. 2. Although it is, of course, possible to receive TV signals in the cut-off zone, the quality of received images is unavoidably deteriorated, because the receivable band zone is substantially restricted.

Further, as the tuned frequency differs in the Normal channel plan and the HRC channel, it requires surplus time to tune the PLL tuning starting from a tuning frequency to the other tuning frequency.

The present invention is developed to overcome the above-mentioned drawbacks in the conventional prior art, and its object is to provide a method for tuning the channel of broadcasting waves which is able to automatically obtain the required band zone and to shorten time required for tuning.

BRIEF DESCRIPTION OF THE INVENTION

In order to attain said object, the method for tuning the channel of broadcasting waves according to the present invention is characterized in that, in tuning broadcasted channel, the PLL tuning is started from the data at center frequency which is either the first channel plan pre-memorized or the second channel plan differing in the frequency arrangement of the first channel plan, it judges whether the broadcasting station belongs to the first channel plan or the second channel plan in conformity with the tuned frequency at the time of completion of the channel selection, and the data of the memorized center frequencies are renewed in accordance with the judged result.

In tuning by applying the PLL tuning, the method for tuning the channel of broadcasting waves according to the present invention judges whether the channel received in selecting broadcasted waves belongs to either the first channel plan or the second channel plan in accordance with the frequency data tuned after selecting, and renews the frequency of the selected channel to the central frequency of the broadcasting station having the channel plan in which the memorized central frequency of the selected station is judged in accordance with the judged result.

In accordance with this renewal, it becomes possible to start the tuning by applying the central frequency of the judged channel from next time and, accordingly, it becomes possible to shorten the time required for tuning.

Further, as the renewal of the data regarding the selected channel is performed every time at the tuning selection, it becomes possible to always correspond to receive in the different region having a different broadcasting channel plan and to increase reliability.

BRIEF DESCRIPTION OF THE DRAWINGS

FIG. 3 is a block diagram of a conventional CATV receiver.

DETAILED DESCRIPTION OF THE INVENTION

An embodiment according to the present invention is described in detail with reference to the accompanying drawings as follows.

Figure 1:
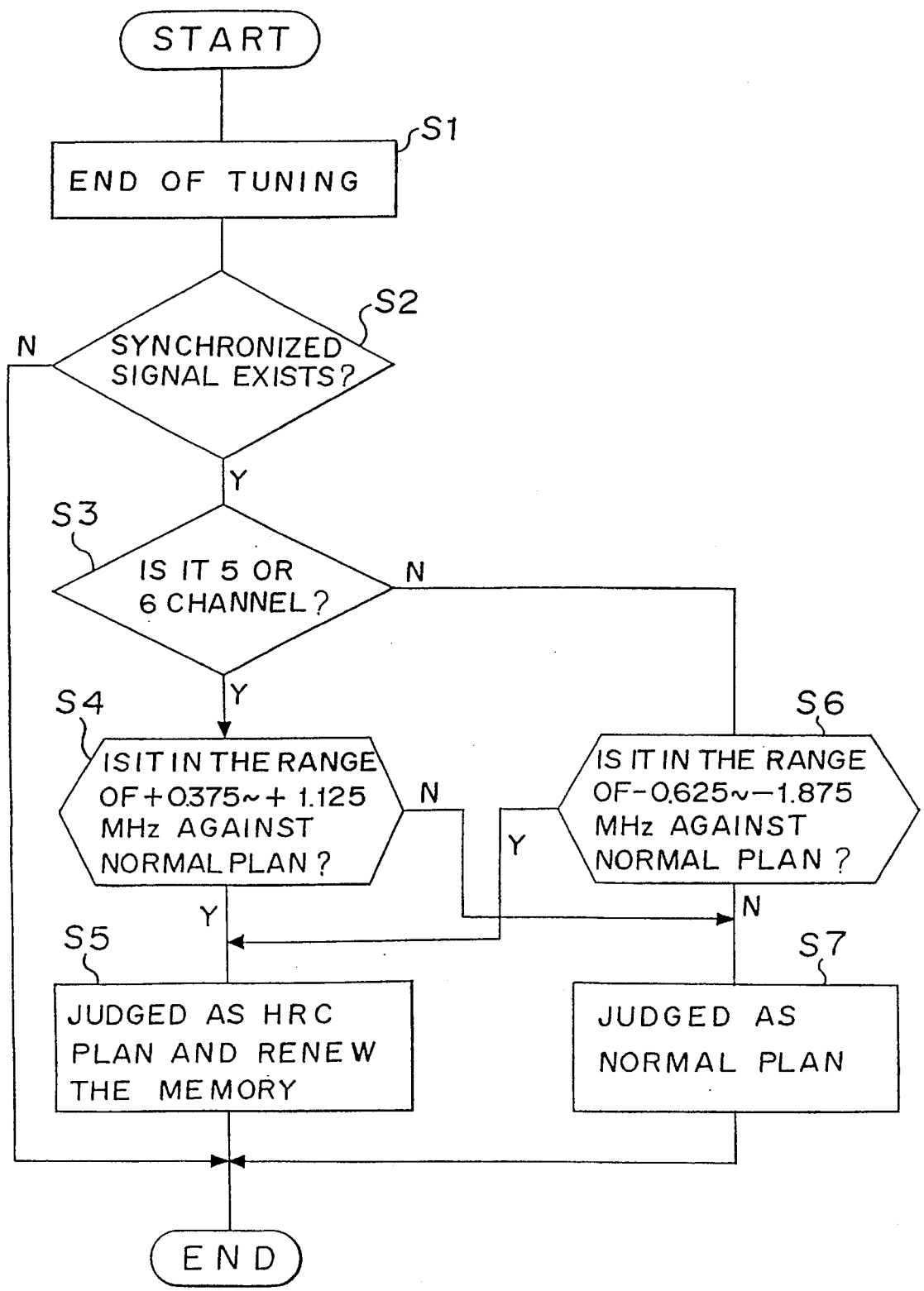
FIG. 1 is a flow chart of one embodiment of the method for tuning the channel of the broadcasting waves according to the present invention.

FIG. 1 is a flow chart explaining the method of tuning the channels of broadcasting waves according to the present invention by taking up the broadcasting waves of the CATV station as an example. In this case, the Normal channel plan and the HRC channel plan are considered, respectively, the first channel plan and the second channel plan.

According to this flow chart, first, in tuning by applying the PLL tuning method 32 controlled by the microcomputer CPU 31, the first tuning for the first tuning of certain CATV channels is started by applying the Normal channel plan which is equivalent to the initial value.

After the selection of the CATV channel is completed in step S1, the existence of the synchronous signal is confirmed in step S2. If the synchronous signal exists, it means that there is one station, and then it is judged whether the station is channel no. 5 or no. 6, or another channel in step S3.

If the station is channel no. 5 or channel no. 6, it is confirmed in step S4 whether the tuned frequency at the end of the tuning operation is the range of plus 0.75 MHz plus 1.125 MHz against the center frequency of the Normal channel plan or not, and if within the range, the memorized value is renewed as the station is in the HRC channel plan in step S5, and if out of range, the station is judged as in the Normal channel plan in step S7. When the frequency is out of range, the memorized tuning data are not renewed.

Figure 2:
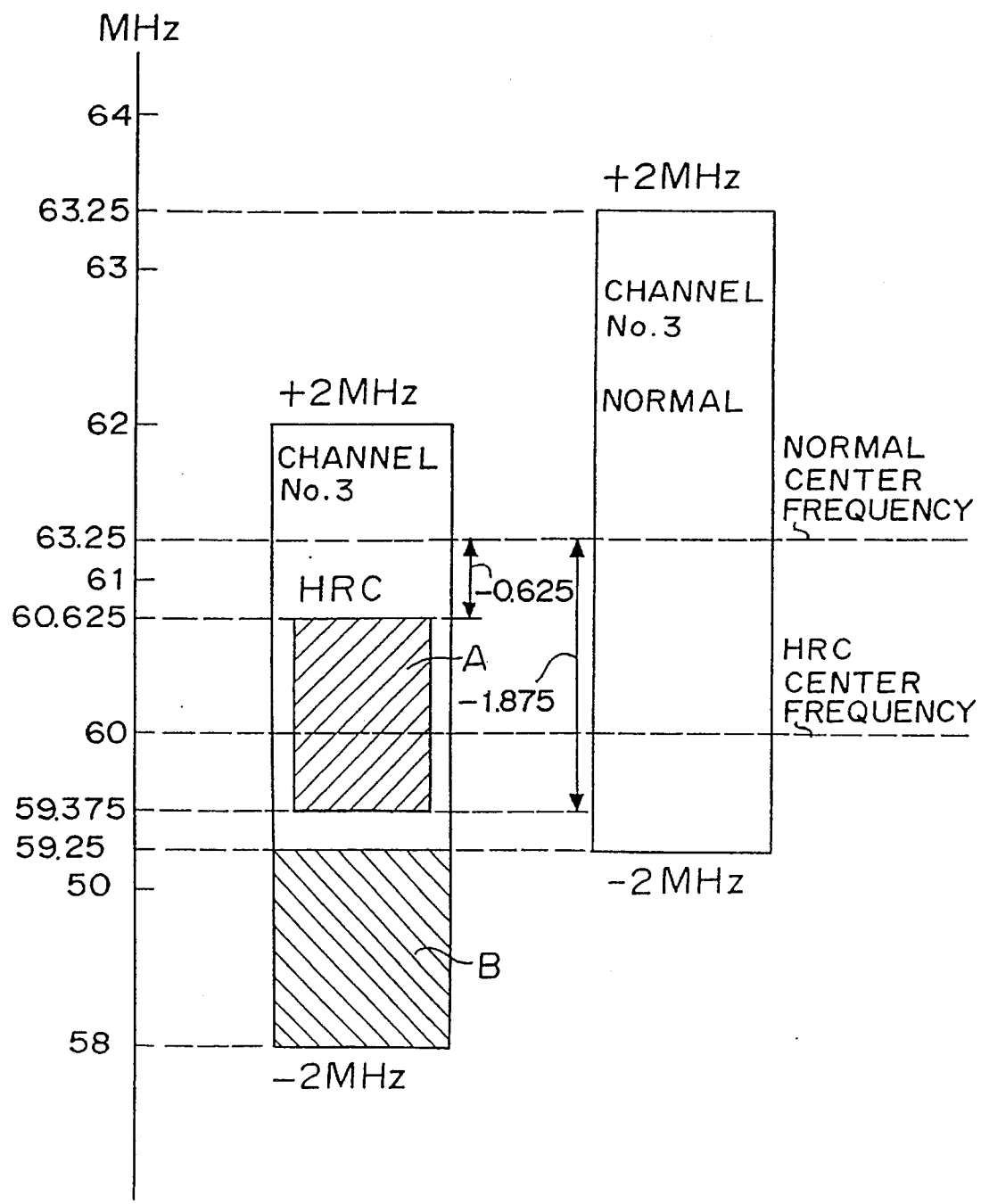
FIG. 2 is an explanatory diagram showing the frequency band zone of the CATV channel plan.

Furthermore, if the station is not in channel no. 5 or channel no. 6, the tuned frequency at the end time of the tuning is confirmed whether in the range of minus 0.625 MHz—minus 1.875 MHz against the center frequency of the Normal channel plan or not, in step S6, and if the frequency is within the range, the memorized data is renewed as the station is in the HRC channel plan in step S5, and if the frequency is out of range, it is judged as the Normal channel plan in step S7. If the frequency is out of range, the memorized tuning data are not renewed. In FIG. 2, the frequency range defined in step S6 is shown with zone B. However, in this description, channel no. 3 is used as an example.

As described above, the tuning method of the CATV channel according to the present invention judges whether the received channel is of the Normal channel plan or the HRC channel plan by applying the frequency data tuned after selection of the station is performed if receiving the CATV broadcasting wave, and renews the memorized data for selecting the station. This judgement is performed every time when the selection is completed.

As described above, when performing the PLL tuning, the tuning method for selecting the broadcasting wave according to the present invention judges whether the channel received in the case of receiving the broadcasting wave belongs to the first channel plan or the second channel plan differing from the allocation of the frequency by applying the frequency data tuned after the selection of the station is performed, and further renews the memorized data for selecting the station (equivalent to the center frequency).

As a consequence of this renewal, it becomes possible to start the selection by applying the selected data to the judged channel on any occasion, and to shorten the time required for tuning.

More further, as the above-mentioned data renewal for selecting the station is performed in every selection of stations, it becomes possible to correspond to receiving in other regions having different channel plans of the broadcasting waves, and to improve operational freedom.

What is claimed is:

1. A method for tuning a channel of a broadcasting wave, comprising steps of:

PLL tuning by applying memorized data of a center frequency of either a first channel plan or a second channel plan differing from allocation of frequencies of said first channel plan;

judging whether a tuned channel belongs to either the first channel plan or the second channel plan by applying a tuned frequency at a time that tuning is finished; and renewing said memorized data of the center frequency according to a judged result.

2. A method for tuning a channel of a broadcasting wave according to claim 1, further comprises a step of checking existence of a synchronous signal for confirming a channel is tuned.

3. A method for tuning a channel of a broadcasting wave according to claim 1, further comprises a step of judging whether the tuned channel is channel no. 5/no. 6 or another channel.

4. A method for tuning a channel of a broadcasting wave according to claim 3, further comprises a step of confirming whether the tuned frequency is in the range between plus 0.75 MHZ and plus 1.125 MHZ of the center frequency of said first channel plan or said second channel plan.

5. A method for tuning a channel of a broadcasting wave according to claim 3, further comprises a step of confirming whether the tuned frequency is in the range between minus 0.625 MHZ and minus 1.875 MHZ of the center frequency of said first channel plan or said second channel plan.

6. A method for tuning a channel of a broadcasting wave according to claim 4, wherein the tuned channel is in said second channel plan if the tuned frequency is in the range between plus 0.75 MHZ and plus 1.125 MHZ of the center frequency, so that renewal of memorized data of a center frequency is needed.

7. A method for tuning a channel of a broadcasting wave according to claim 5, wherein the tuned channel is in said second channel plan if the tuned frequency is in the range between minus 0.625 MHZ and minus 1.875 MHZ of the center frequency, so that renewal of memorized data of a center frequency is needed.

8. A method for tuning a channel of a broadcasting wave according to claim 4, wherein the tuned channel is in said first channel plan if the tuned frequency is not in the range between plus 0.75 MHZ and plus 1.125 MHZ of the center frequency, so that renewal of memorized data of a center frequency is not needed.

9. A method for tuning a channel of a broadcasting wave according to claim 5, wherein the tuned channel is in said first channel plan if the tuned frequency is not in the range between minus 0.625 MHZ and minus 1.875 MHZ of the center frequency, so that renewal of memorized data of a center frequency is not needed.

* * * * *